(12) United States Patent
Kuwata et al.

(10) Patent No.: US 11,336,235 B2
(45) Date of Patent: May 17, 2022

(54) AMPLIFIER

(71) Applicant: Mitsubishi Electric Corporation, Tokyo (JP)

(72) Inventors: Eigo Kuwata, Tokyo (JP); Jun Nishihara, Tokyo (JP)

(73) Assignee: MITSUBISHI ELECTRIC CORPORATION, Tokyo (JP)

(*) Notice: Subject to any disclaimer, the term of this patent is extended or adjusted under 35 U.S.C. 154(b) by 29 days.

(21) Appl. No.: 16/996,614

(22) Filed: Aug. 18, 2020

(65) Prior Publication Data

US 2020/0382077 A1 Dec. 3, 2020

Related U.S. Application Data

(63) Continuation of application No. PCT/JP2018/009998, filed on Mar. 14, 2018.

(51) Int. Cl.
H03F 3/191 (2006.01)
H03F 1/56 (2006.01)

(52) U.S. Cl.
CPC ............... *H03F 1/565* (2013.01); *H03F 1/56* (2013.01); *H03F 2200/318* (2013.01); *H03F 2200/423* (2013.01)

(58) Field of Classification Search
CPC . H03F 1/56; H03F 1/565; H03F 3/191; H03F 3/193; H03F 2200/318; H03F 2200/423
USPC ......................................... 330/302, 305, 306
See application file for complete search history.

(56) References Cited

U.S. PATENT DOCUMENTS 6,078,794 A * 6/2000 Peckham .................. H03F 1/56
330/279
6,177,841 B1 1/2001 Ohta et al.
2013/0176079 A1 7/2013 Uno et al.

FOREIGN PATENT DOCUMENTS

JP 6-224661 A 8/1994
JP 2000-106510 A 4/2000
WO WO 2013/001711 A1 1/2013

OTHER PUBLICATIONS

German Office Action for German Application No. 11 2018 007 069.7, dated Jun. 30, 2021, with English translation.

* cited by examiner

*Primary Examiner* — Khanh V Nguyen
(74) *Attorney, Agent, or Firm* — Birch, Stewart, Kolasch & Birch, LLP

(57) ABSTRACT

An amplifier is configured in such a way that a first capacitor resonates at the frequency of a second harmonic wave included in a signal outputted from an amplifying element, a circuit including a second transmission line, the first capacitor, and a second capacitor resonates at the frequency of a third harmonic wave included in the signal outputted from the amplifying element, and also matches the impedance for a fundamental wave together with an impedance matching circuit.

5 Claims, 11 Drawing Sheets

——△—— In the Case in Which No Electromagnetic Coupling Is Implemented
——□—— n the Case in Which Electromagnetic Coupling Is Implemented

AMPLIFIER

CROSS REFERENCE TO RELATED APPLICATION

This application is a Continuation of PCT International Application No. PCT/JP2018/009998, filed on Mar. 14, 2018, which is hereby expressly incorporated by reference into the present application.

TECHNICAL FIELD

The present disclosure relates to an amplifier including an amplifying element that amplifies an inputted signal.

BACKGROUND ART

In following Patent Literature 1, an amplifier including an amplifying element for amplifying an inputted signal is disclosed.

In the amplifier disclosed in Patent Literature 1, both a first series resonant circuit and a second series resonant circuit are connected in parallel to the output terminal of the amplifying element.

The resonance frequency of the first series resonant circuit is higher than the frequency of a second harmonic wave included in the inputted signal.

The resonance frequency of the second series resonant circuit is lower than the frequency of a third harmonic wave included in the inputted signal.

CITATION LIST

Patent Literature

Patent Literature 1: WO 2013/001711

SUMMARY OF INVENTION

Technical Problem

Because the conventional amplifier includes the first series resonant circuit and the second series resonant circuit, a match of the impedance for each of the second and third harmonic waves can be achieved. However, each of the first and second series resonant circuits does not make a match of the impedance for a fundamental wave included in the inputted signal.

Therefore, a problem with the conventional amplifier is that there occurs a net loss in which the electric power of the fundamental wave is changed into heat, and the efficiency is reduced.

The present disclosure is made in order to solve the above-mentioned problem, and it is therefore an object of the present disclosure to provide an amplifier that prevents the occurrence of a net loss in which the electric power of a fundamental wave is changed into heat, thereby being able to prevent reduction in the efficiency.

Solution to Problem

According to the present disclosure, there is provided an amplifier including: an amplifying element for amplifying an inputted signal and outputting the amplified signal; a first transmission line in which one end is connected to an output terminal for signals in the amplifying element; a second transmission line in which one end is connected to the other end of the first transmission line; a first capacitor in which one end is connected to the other end of the first transmission line, and the other end is grounded; a second capacitor in which one end is connected to the other end of the first transmission line, and the other end is connected to the other end of the second transmission line; and an impedance matching circuit in which one end is connected to the other end of the second transmission line, and the other end thereof is connected to the output terminal, and that matches impedance for a fundamental wave included in the signal outputted from the amplifying element, and after matching the impedance, outputs a signal via the output terminal connected to the other end thereof, wherein the first capacitor resonates at the frequency of a second harmonic wave included in the signal outputted from the amplifying element, and a circuit including the second transmission line, the first capacitor, and the second capacitor resonates at the frequency of a third harmonic wave included in the signal outputted from the amplifying element and also matches the impedance for the fundamental wave together with the impedance matching circuit.

Advantageous Effects of Invention

According to the present disclosure, the amplifier is configured in such a way that the first capacitor resonates at the frequency of the second harmonic wave included in the signal outputted from the amplifying element, and the circuit including the second transmission line, the first capacitor, and the second capacitor resonates at the frequency of the third harmonic wave included in the signal outputted from the amplifying element and also matches the impedance for the fundamental wave included in the signal outputted from the amplifying element together with the impedance matching circuit. Therefore, the amplifier according to the present disclosure prevents the occurrence of a net loss in which the electric power of the fundamental wave is changed into heat, thereby being able to prevent reduction in the efficiency.

BRIEF DESCRIPTION OF DRAWINGS

FIG. 3 is an equivalent circuit for a third harmonic wave in the amplifier shown in

FIG. 1;

FIG. 5 is an equivalent circuit for a fundamental wave in the amplifier shown in

FIG. 1;

FIG. 6 is an equivalent circuit for the fundamental wave in the amplifier shown in

FIG. 1;

FIG. 13 is an equivalent circuit for a fundamental wave in the amplifier shown in

FIG. 10;

FIG. 18 is an equivalent circuit for a fundamental wave in the amplifier shown in

FIG. 15;

DESCRIPTION OF EMBODIMENTS

Hereinafter, in order to explain the present disclosure in greater detail, embodiments of the present disclosure will be described with reference to the accompanying drawings.

Embodiment 1

Figure 1:
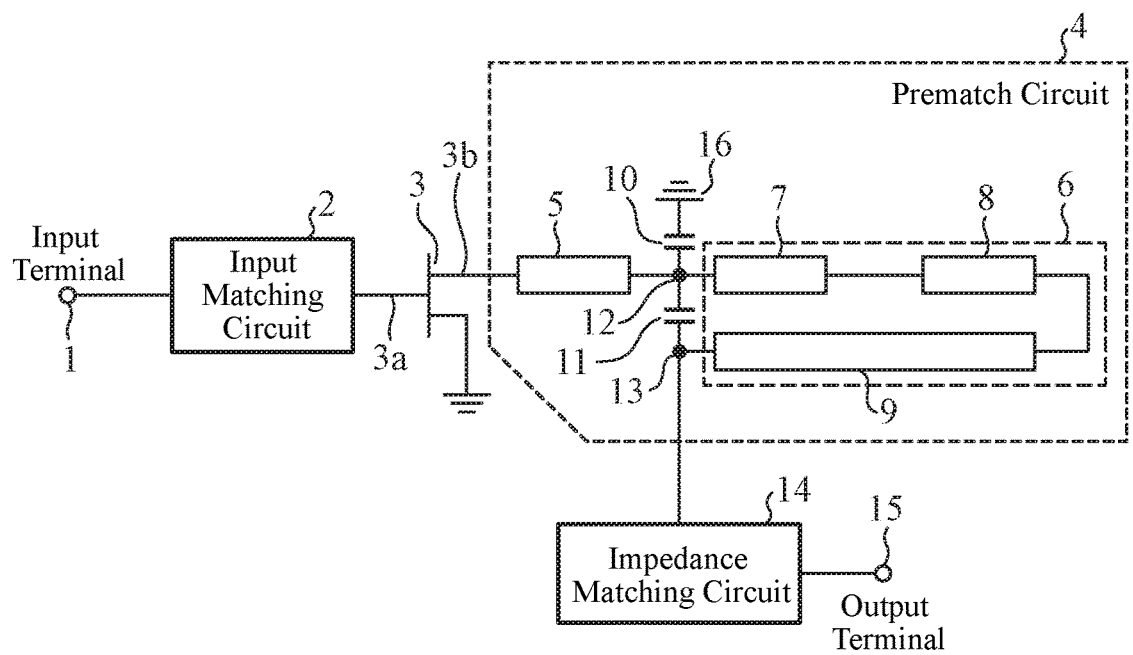
FIG. 1 is a block diagram showing an amplifier according to Embodiment 1.

FIG. 1 is a block diagram showing an amplifier according to Embodiment 1.

In FIG. 1, an input terminal 1 is a terminal to which a signal including, in addition to a fundamental wave, a second harmonic wave and a third harmonic wave is inputted.

In an input matching circuit 2, one end is connected to the input terminal 1, and the other end is connected to an input terminal 3a for signals in an amplifying element 3.

The input matching circuit 2 makes a match between the impedance of the input terminal 1 for the fundamental wave and the impedance for the fundamental wave when the amplifying element 3 is viewed from the input terminal 1.

The amplifying element 3 is implemented by a field effect transistor (FET), a bipolar junction transistor (BJT), or the like.

In the amplifying element 3, the input terminal 3a is connected to the other end of the input matching circuit 2 and an output terminal 3b is connected to a prematch circuit 4, and the amplifying element amplifies a signal inputted from the input terminal 1 and passing through the input matching circuit 2, and outputs the amplified signal to the prematch circuit 4.

The prematch circuit 4 includes a first transmission line 5, a second transmission line 6, a first capacitor 10, and a second capacitor 11.

The first transmission line 5 is a line in which one end is connected to the output terminal 3b for signals in the amplifying element 3, and the other end is connected to a connection point 12.

The second transmission line 6 includes a third transmission line 7, a fourth transmission line 8, and a fifth transmission line 9.

The third transmission line 7 is a line in which one end is connected to the connection point 12, and the other end is connected to one end of the fourth transmission line 8.

The fourth transmission line 8 is a line in which one end is connected to the other end of the third transmission line 7, and the other end is connected to one end of the fifth transmission line 9.

The fifth transmission line 9 is a line in which the one end is connected to the other end of the fourth transmission line 8, and the other end is connected to a connection point 13.

In the first capacitor 10, one end is connected to the connection point 12, and the other end is connected to a ground 16, so that the other end is grounded.

In the first capacitor 10, the resonance frequency of the first capacitor 10 is set in such a way that the first capacitor resonates at the frequency of the second harmonic wave included in the signal outputted from the amplifying element 3.

An inductor (not illustrated) is present between the first capacitor 10 and the ground 16.

The inductor (not illustrated) has an inductance that is the sum total of the parasitic inductance of the first capacitor 10 and the parasitic inductance caused by the circuit pattern of the amplifier shown in FIG. 1.

In the second capacitor 11, one end is connected to the connection point 12, and the other end is connected to the connection point 13.

The capacitance value of the second capacitor 11 is set in such a way that the impedance for the fundamental wave in the second capacitor 11 is higher than the impedance for the fundamental wave when the third transmission line 7 is viewed from the connection point 12.

A circuit including the second transmission line 6, the first capacitor 10, and the second capacitor 11 is set up in such a way as to resonate at the frequency of the third harmonic wave included in the signal outputted from the amplifying element 3.

The connection point 12 is a point where the other end of the first transmission line 5, the one end of the third transmission line 7, the one end of the first capacitor 10, and the one end of the second capacitor 11 are connected to one another.

The connection point 13 is a point where the other end of the fifth transmission line 9, the other end of the second capacitor 11, and one end of the impedance matching circuit 14 are connected to one another.

In the impedance matching circuit 14, the one end is connected to the connection point 13, and the other end is connected to the output terminal 15.

The impedance matching circuit 14 makes a match between the impedance for the fundamental wave when the prematch circuit 4 is viewed from the output terminal 15, and the impedance for the fundamental wave in an external load (not-illustrated) connected to the output terminal 15.

The output terminal 15 is a terminal via which the fundamental wave included in the signal amplified by the amplifying element 3 is outputted.

Figure 2:
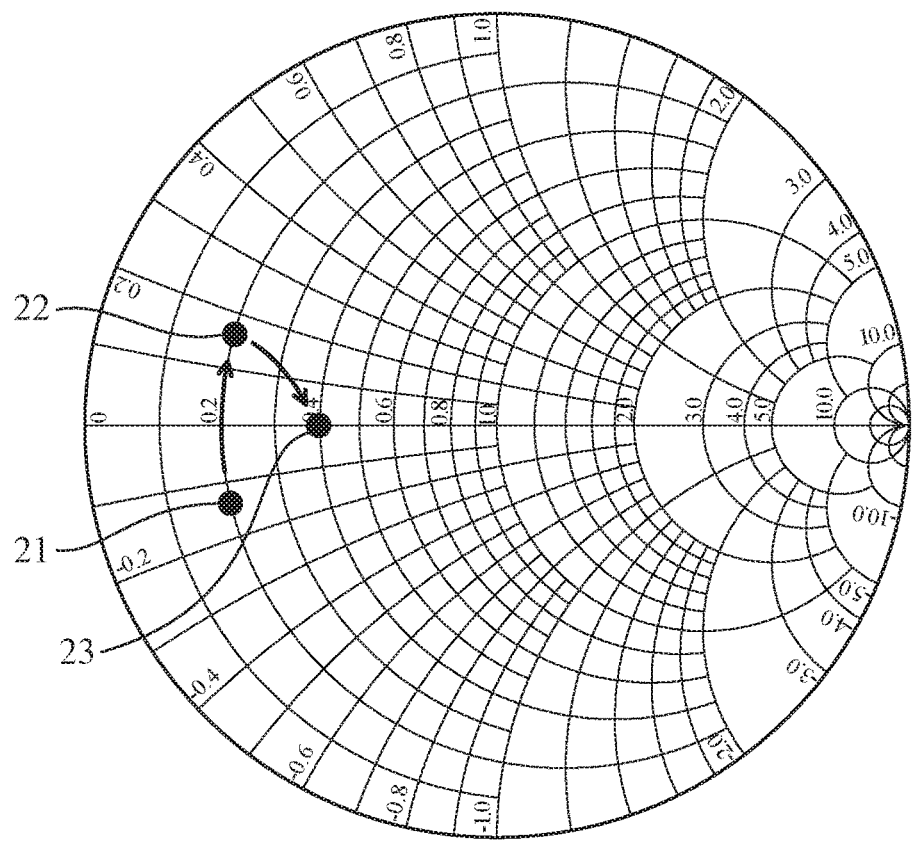
FIG. 2 is an explanatory drawing showing the impedance transformation of the amplifier according to Embodiment 1.

FIG. 2 is an explanatory drawing showing the impedance transformation of the amplifier according to Embodiment 1.

Next, the operation of the amplifier shown in FIG. 1 will be explained by referring to FIG. 2.

The resonance frequency of the first capacitor 10 is set in such a way that the first capacitor 10 resonates at the frequency of the second harmonic wave included in the signal outputted from the amplifying element 3.

The capacitance value of the second capacitor 11 is set in such a way that the impedance for the fundamental wave in the second capacitor 11 is higher than the impedance for the fundamental wave when the third transmission line 7 is viewed from the connection point 12.

The circuit including the second transmission line 6, the first capacitor 10, and the second capacitor 11 is set up in such a way as to resonate at the frequency of the third harmonic wave included in the signal outputted from the amplifying element 3.

In FIG. 2, 21 denotes a conjugate matched impedance that is an optimum load impedance.

The optimum load impedance is an impedance when the prematch circuit 4 is viewed from the output terminal 3b at the time that the efficiency of the amplifying element 3 becomes a maximum at the frequency of the fundamental wave included in the signal inputted from the input terminal 1.

The conjugate matched impedance 21 that is the optimum load impedance is transformed into an impedance 22 in an inductive region by the first transmission line 5, as shown in FIG. 2.

The impedance 22 is transformed into an impedance 23 close to a real axis by the first capacitor 10, as shown in FIG. 2.

Figure 3:
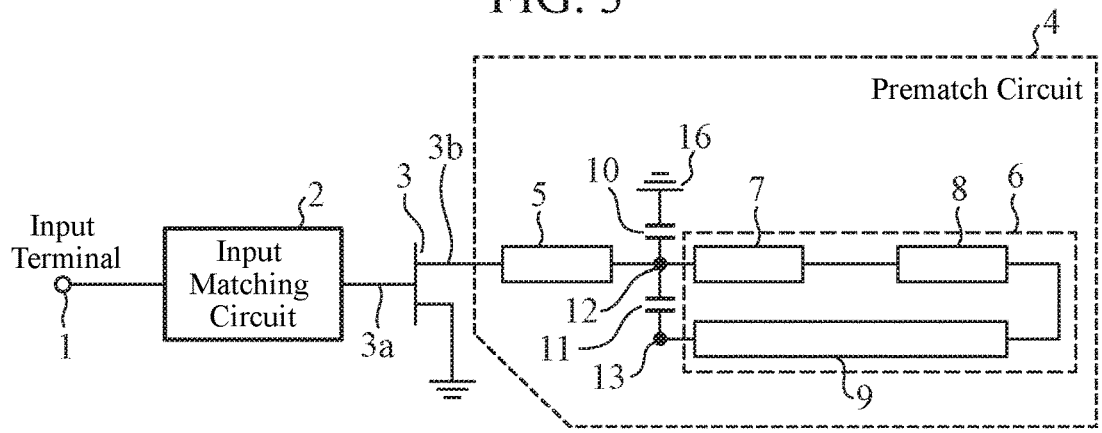
Figure 4:
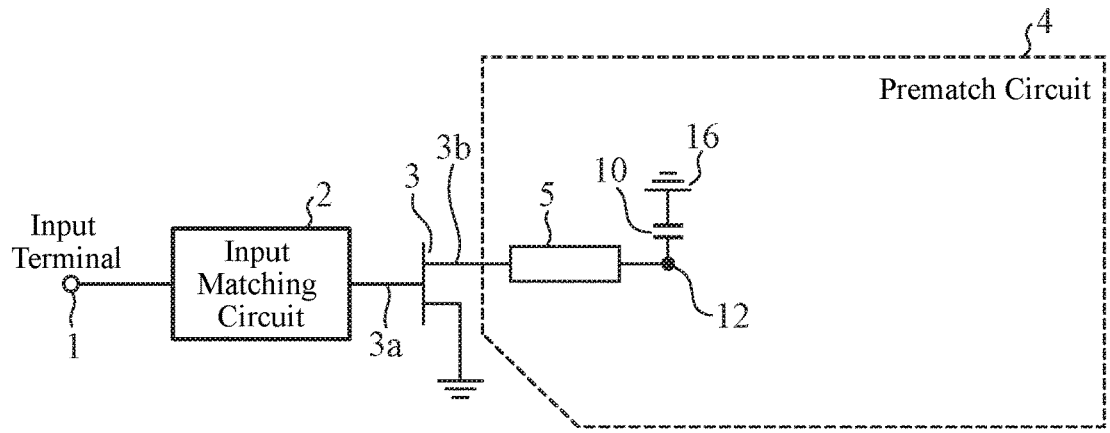
FIG. 4 is an equivalent circuit for a second harmonic wave in the amplifier shown in FIG. 1.

Here, FIG. 3 is an equivalent circuit for the third harmonic wave in the amplifier shown in FIG. 1, and FIG. 4 is an equivalent circuit for the second harmonic wave in the amplifier shown in FIG. 1.

Figure 5:
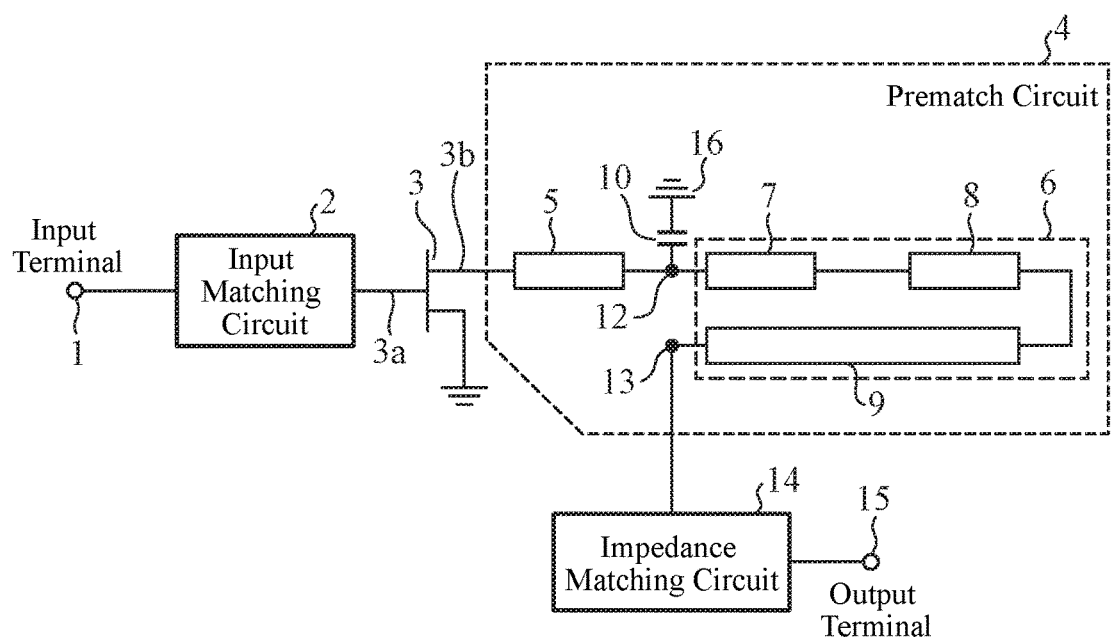

Further, FIG. 5 is an equivalent circuit for the fundamental wave in the amplifier shown in FIG. 1.

Figure 6:
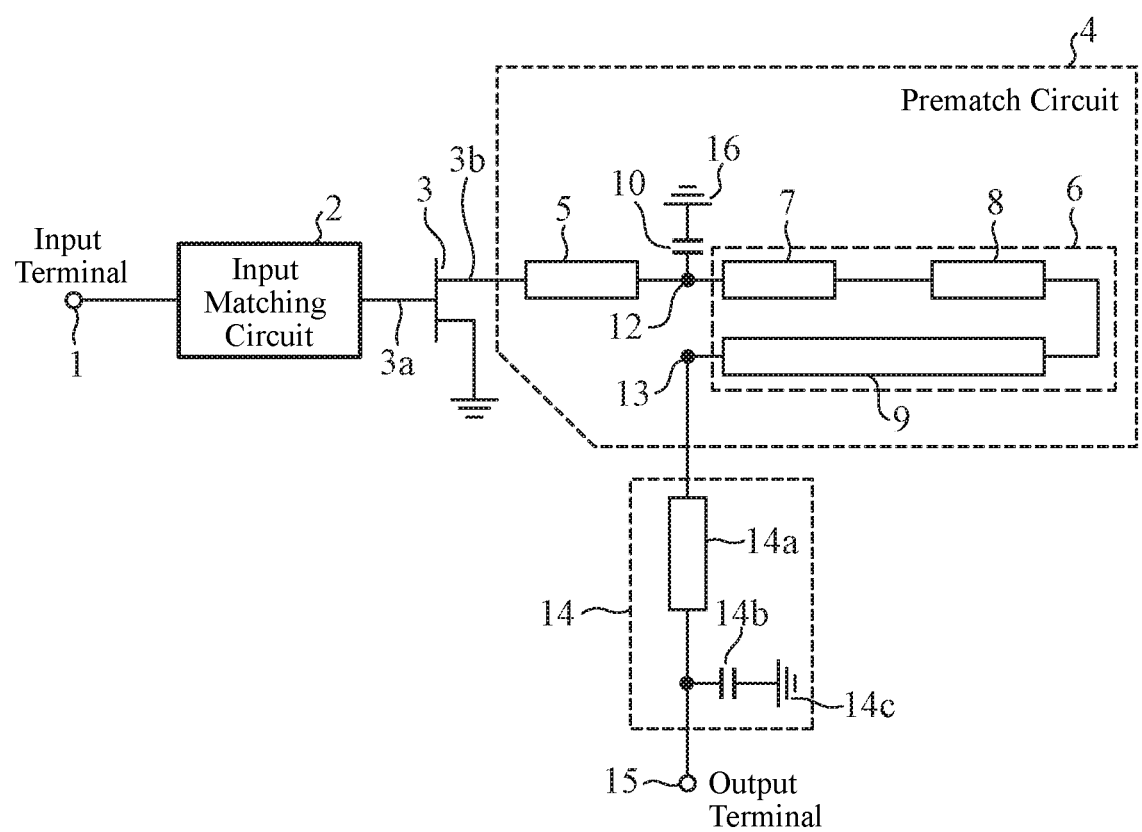

FIG. 6 is an equivalent circuit for the fundamental wave in the amplifier shown in FIG. 1, like FIG. 5.

In FIG. 6, an example of the internal configuration of the impedance matching circuit 14 is shown.

Because the circuit including the second transmission line 6, the first capacitor 10, and the second capacitor 11 resonates at the frequency of the third harmonic wave, the impedance matching circuit 14 disappears from the connection point 13 of the prematch circuit 4 at the frequency of the third harmonic wave, as shown in FIG. 3.

Because the first capacitor 10 resonates at the frequency of the second harmonic wave, both the third transmission line 7 and the second capacitor 11 disappear from the connection point 12 of the prematch circuit 4 at the frequency of the second harmonic wave, as shown in FIG. 4.

In FIG. 6, the impedance matching circuit 14 is a single-stage low pass filter (LPF) type impedance transformer.

The impedance matching circuit 14 includes a transmission line 14a in which one end is connected to the connection point 13 and the other end is connected to the output terminal 15, and a capacitor 14b in which one end is connected to the other end of the transmission line 14a and the other end is connected to a ground 14c.

Figure 7:
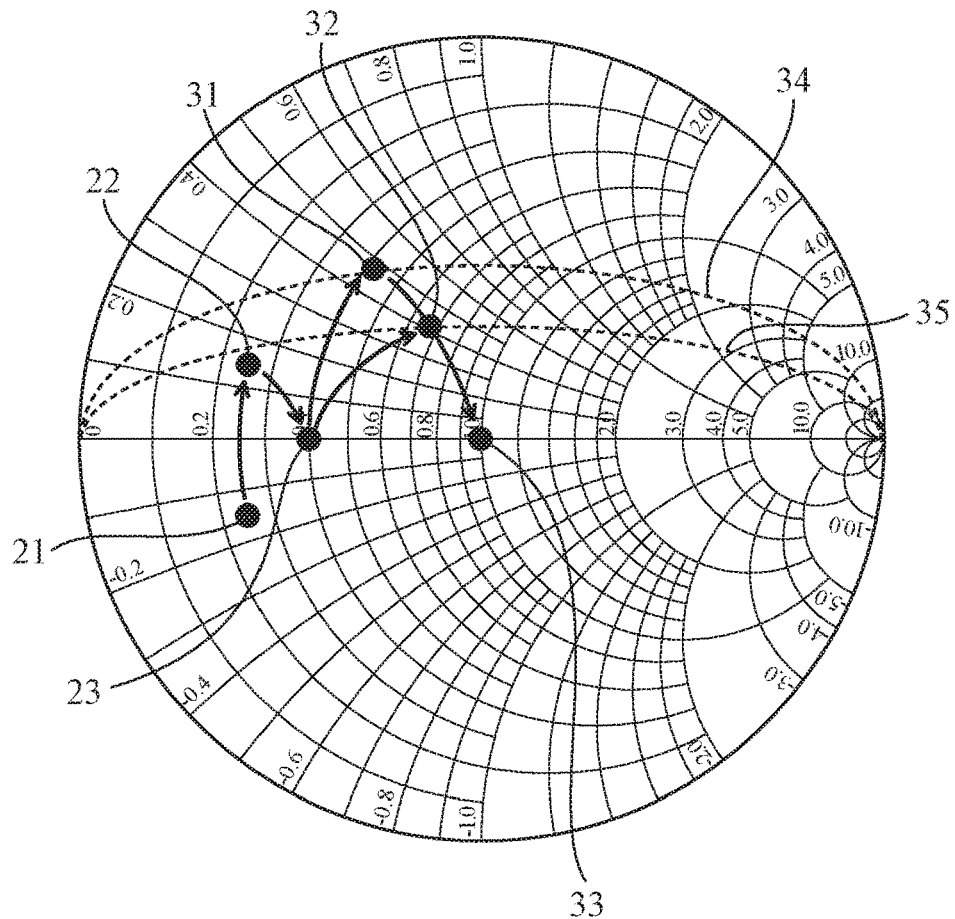
FIG. 7 is an explanatory drawing showing the impedance transformation of the amplifier shown in FIG. 6.

FIG. 7 is an explanatory drawing showing the impedance transformation of the amplifier shown in FIG. 6. In FIG. 7, the same reference signs as those shown in FIG. 2 denote the same elements or like elements.

The conjugate matched impedance 21 that is the optimum load impedance is transformed into the impedance 22 in the inductive region by the first transmission line 5, as shown in FIG. 7.

The impedance 22 in the inductive region is transformed into the impedance 23 close to the real axis by the first capacitor 10, as shown in FIG. 7.

The impedance 23 close to the real axis is transformed into an impedance in the inductive region by the second transmission line 6 and the transmission line 14a, as shown in FIG. 7.

Both 31 and 32 denote impedances transformed by the second transmission line 6 and the transmission line 14a.

In a case in which each of the third and fourth transmission lines 7 and 8 is not electromagnetically coupled to the fifth transmission line 9, the impedance 23 is transformed into the impedance 31 by the second transmission line 6 and the transmission line 14a.

In a case in which each of the third and fourth transmission lines 7 and 8 is electromagnetically coupled to the fifth transmission line 9, the impedance 23 is transformed into the impedance 32 by the second transmission line 6 and the transmission line 14a.

When the distance between each of the third and fourth transmission lines 7 and 8 and the fifth transmission line 9 is, for example, approximately three times or less the thickness of the board on which the amplifier shown in FIG. 6 is mounted, there is a case in which each of the third and fourth transmission lines 7 and 8 is electromagnetically coupled to the fifth transmission line 9.

The impedance 31 or 32 is transformed into an impedance 33 of 50Ω by the capacitor 14b, as shown in FIG. 7.

Here, the impedance 31 in the case in which no electromagnetic coupling is implemented has a larger quality factor (Q factor) than the impedance 32 in the case in which electromagnetic coupling is implemented.

In FIG. 7, an equi-Q circle 34 and an equi-Q circle 35 are curves each showing a Q factor of the same value, and the Q factor shown by the equi-Q circle 34 is higher than the Q factor shown by the equi-Q circle 35. Therefore, the impedance 31 existing in the equi-Q circle 34 has a larger Q factor than the impedance 32 existing in the equi-Q circle 35.

In a lossless circuit like an output circuit of the amplifier, the Q factor is not a parameter showing a net loss, but is a parameter showing the operation band and whether the impedance matching is good or bad.

Because the impedance 32 in the case in which electromagnetic coupling is implemented has a smaller Q factor than the impedance 31 in the case in which no electromagnetic coupling is implemented, the amplifier in which electromagnetic coupling is implemented can implement better impedance matching over a wide band than the amplifier in which no electromagnetic coupling is implemented.

Next, the characteristics of the amplifier shown in FIG. 1 will be explained.

It is assumed that the impedance matching circuit 14 of the amplifier includes the transmission line 14a and the capacitor 14b, as shown in FIG. 6.

Hereinafter, a result of a simulation of the characteristics of the amplifier in the case in which each of the third and fourth transmission lines 7 and 8 is not electromagnetically coupled to the fifth transmission line 9, and a result of a simulation of the characteristics of the amplifier in the case in which each of the third and fourth transmission lines is electromagnetically coupled to the fifth transmission line.

Simulation conditions for the characteristics of the amplifier are as follows.

The center frequency of the fundamental wave is 100 MHz.

Further, the conjugate matched impedance 21 that is the optimum load impedance is replaced by the impedance of an RC parallel circuit, and the value of resistance of the resistor included in the RC parallel circuit is 10Ω and the capacitance value of the capacitor included in the RC parallel circuit is 100 pF.

Further, the relative dielectric constant of the board on which the amplifier shown in FIG. 1 is mounted is 4, the dielectric loss tangent of the board is 0, the thickness of the board is 1 mm, the conductor thickness of the board is 0.05 mm, and the conductor loss of the board is 0.

The designed values of the amplifier in the case in which no electromagnetic coupling is implemented are as follows.

The line width of the first transmission line 5 is 2 mm, and the line length of the first transmission line 5 is 50 mm.

The capacitance value of the first capacitor 10 is 75 pF, and the parasitic inductance of the first capacitor 10 is 8.5 nH.

The line width of the second transmission line 6 is 2 mm, and the line length of the second transmission line 6 is 42 mm.

The capacitance value of the second capacitor 11 is 24 pF.

The line width of the transmission line 14a is 2 mm, and the line length of the transmission line 14a is 65 mm.

The capacitance value of the capacitor 14b is 59 pF.

The designed values of the amplifier in the case in which electromagnetic coupling is implemented are as follows.

The line width of the first transmission line 5 is 2 mm, and the line length of the first transmission line 5 is 50 mm.

The capacitance value of the first capacitor 10 is 75 pF, and the parasitic inductance of the first capacitor 10 is 8.5 nH.

The line width of each of the third and fourth transmission lines 7 and 8 is 2 mm, and the sum total of the line length of the third transmission line 7 and the line length of the fourth transmission line 8 is 35 mm.

The line width of the fifth transmission line 9 is 2 mm, and the line length of the fifth transmission line 9 is 72 mm.

The spacing between each of the third and fourth transmission lines 7 and 8 and the fifth transmission line 9 is 0.2 mm.

The capacitance value of the second capacitor 11 is 24 pF.

The line width of the transmission line 14a is 2 mm, and the line length of the transmission line 14a is 72 mm.

The capacitance value of the capacitor 14b is 55 pF.

Figure 8:
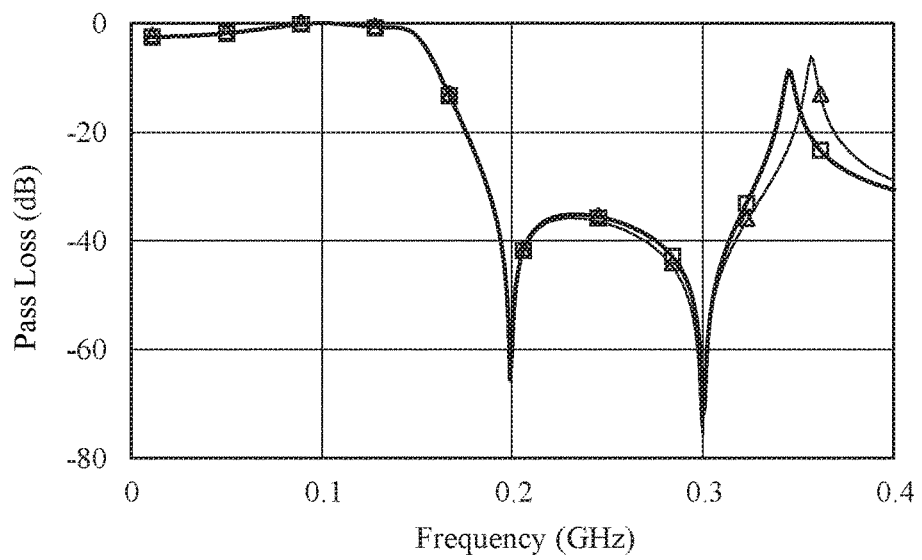
FIG. 8 is an explanatory drawing showing a result of a simulation of a loss in a pass from an output terminal 3b for signals in an amplifying element 3 to an output terminal 15.

FIG. 8 is an explanatory drawing showing a result of a simulation of a loss in a pass from the output terminal 3b for signals in the amplifying element 3 to the output terminal 15.

Even in the case in which electromagnetic coupling is implemented and even in the case in which no electromagnetic coupling is implemented, the pass loss is approximately 0 dB at a frequency close to 100 MHz that is the center frequency of the fundamental wave.

At 200 MHz that is the frequency of the second harmonic wave and at 300 MHz that is the frequency of the third harmonic wave, the pass loss is equal to or less than −60 dB and is very small.

Therefore, the simulation result of the pass loss shown in FIG. 8 shows that an impedance that causes an efficient operation to be performed can be implemented at each of the frequencies of the fundamental, second harmonic, and third harmonic waves.

Figure 9:
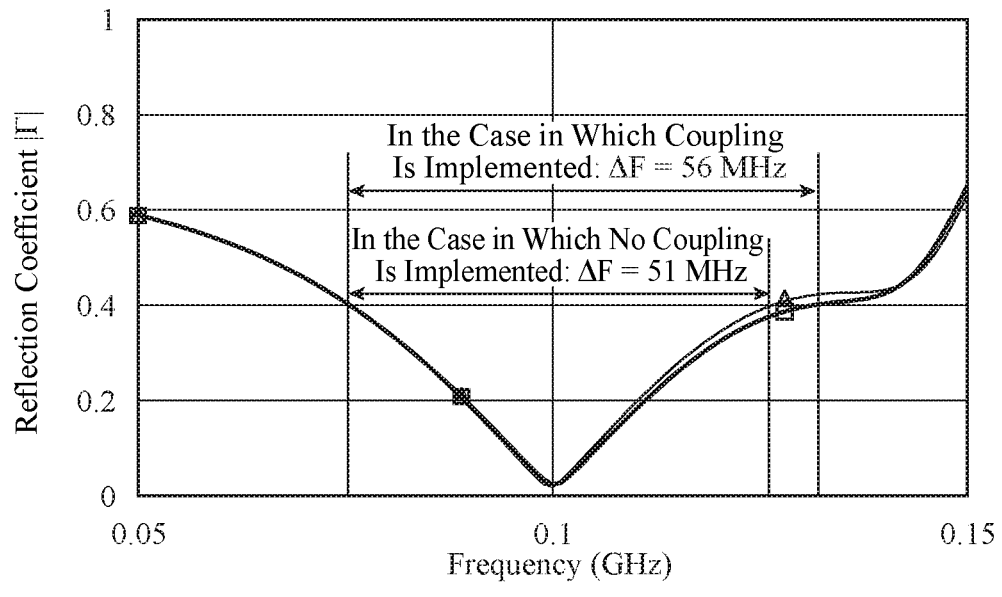
FIG. 9 is an explanatory drawing showing a result of a simulation of the reflection coefficient of the amplifier at the output terminal 15.

FIG. 9 is an explanatory drawing showing a result of a simulation of the reflection coefficient of the amplifier at the output terminal 15.

In FIG. 9, paying attention to the frequency bandwidth within which the reflection coefficient is equal to or less than |Γ|=0.4, it is seen that the bandwidth in the case in which electromagnetic coupling is implemented is approximately 1.1 times as wide as that in the case in which no electromagnetic coupling is implemented.

Therefore, in the case in which the amplifier shown in FIG. 1 is configured in such a way that each of the third and fourth transmission lines 7 and 8 is electromagnetically coupled to the fifth transmission line 9, further band broadening can be implemented as compared with the case in which no electromagnetic coupling is implemented.

Because the first capacitor 10 operates as a resonator that resonates at the frequency of the second harmonic wave, the second harmonic wave is reflected by the first capacitor 10. Therefore, the second harmonic wave is not outputted from the output terminal 15.

Because the circuit including the second transmission line 6, the first capacitor 10, and the second capacitor 11 operates as a resonator that resonates at the frequency of the third harmonic wave, the third harmonic wave is reflected by the circuit including the second transmission line 6, the first capacitor 10, and the second capacitor 11. Therefore, the third harmonic wave is not outputted from the output terminal 15.

Therefore, the amplifier shown in FIG. 1 does not need to have a filter that eliminates each of the second and third harmonic waves.

In above-mentioned Embodiment 1, the amplifier is configured in such a way that the first capacitor 10 resonates at the frequency of the second harmonic wave included in the signal outputted from the amplifying element 3, and the circuit including the second transmission line 6, the first capacitor 10, and the second capacitor 11 resonates at the frequency of the third harmonic wave included in the signal outputted from the amplifying element 3 and also matches the impedance for the fundamental wave together with the impedance matching circuit 14. Therefore, the amplifier prevents the occurrence of a net loss in which the electric power of the fundamental wave is changed into heat, thereby being able to prevent reduction in the efficiency.

Embodiment 2

As the amplifier of Embodiment 1, the example in which the prematch circuit 4 includes the first transmission line 5, the second transmission line 6, the first capacitor 10, and the second capacitor 11 is shown.

In Embodiment 2, an amplifier in which a prematch circuit 4 includes a first transmission line 5, a second transmission line 6, a first capacitor 10, a second capacitor 11, and a third capacitor 41 will be explained.

Figure 10:
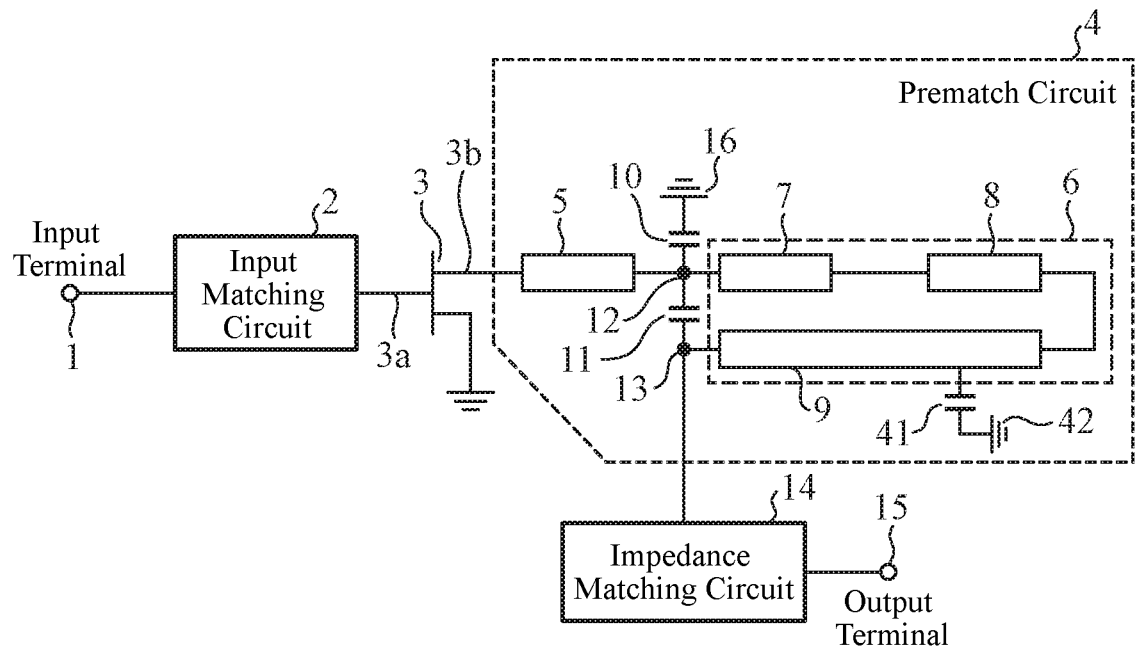
FIG. 10 is a block diagram showing an amplifier according to Embodiment 2.

FIG. 10 is a block diagram showing the amplifier according to Embodiment 2.

In FIG. 10, because the same reference signs as those shown in FIG. 1 denote the same components or like components, an explanation of the components will be omitted hereinafter.

In the third capacitor 41, one end is connected to a fifth transmission line 9, and the other end is connected to a ground 42, so that the other end is grounded.

Figure 11:
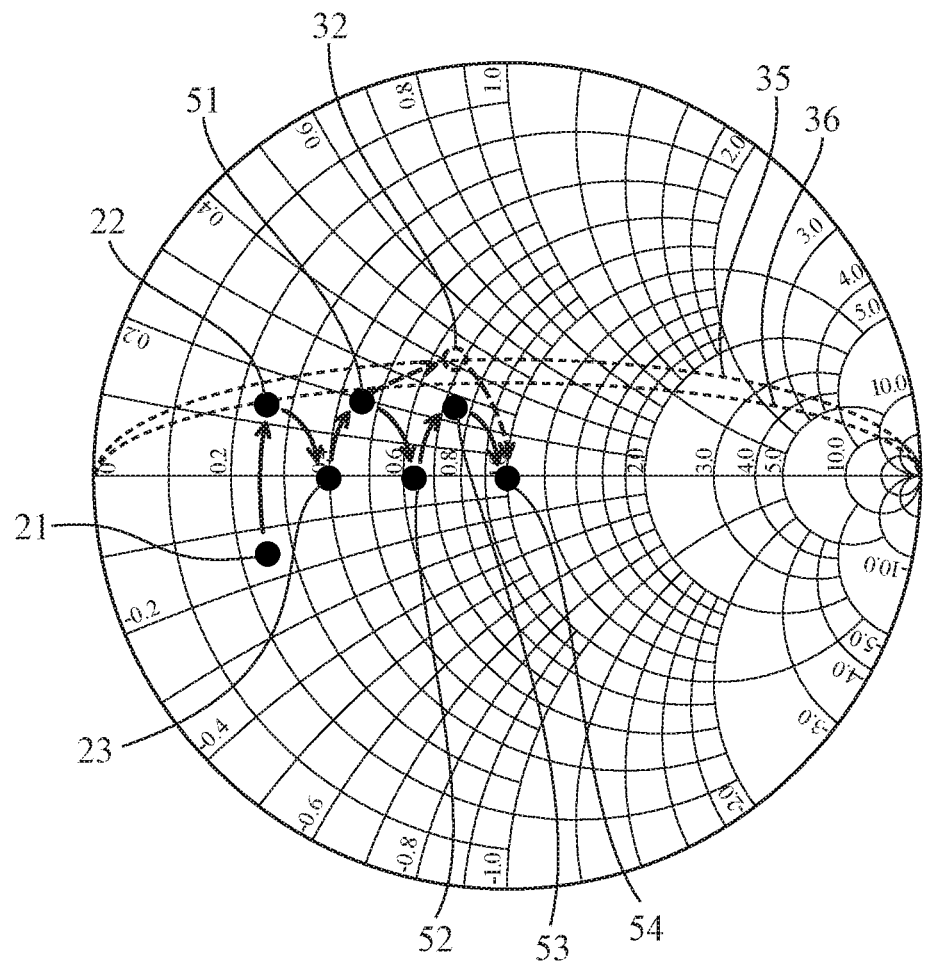
FIG. 11 is an explanatory drawing showing the impedance transformation of the amplifier according to Embodiment 2.

FIG. 11 is an explanatory drawing showing the impedance transformation of the amplifier according to Embodiment 2.

In FIG. 11, the same reference signs as those shown in FIG. 2 denote the same elements or like elements.

Next, the operation of the amplifier shown in FIG. 10 will be explained by referring to FIG. 11.

The resonance frequency of the first capacitor 10 is set in such a way that the first capacitor 10 resonates at the frequency of a second harmonic wave included in a signal outputted from an amplifying element 3.

The capacitance value of the second capacitor 11 is set in such a way that the impedance for a fundamental wave in the second capacitor 11 is higher than the impedance for the fundamental wave when a third transmission line 7 is viewed from a connection point 12.

A circuit including the second transmission line 6, the first capacitor 10, the second capacitor 11, and the third capacitor 41 is set up in such a way as to resonate at the frequency of a third harmonic wave included in the signal outputted from the amplifying element 3.

A conjugate matched impedance 21 that is an optimum load impedance is transformed into an impedance 22 in an inductive region by the first transmission line 5, as shown in FIG. 11.

The impedance 22 in the inductive region is transformed into an impedance 23 close to a real axis by the first capacitor 10, as shown in FIG. 11.

Further, the impedance 23 close to the real axis is transformed into an impedance 51 in the inductive region by a portion of the fifth transmission line 9 closer to a fourth transmission line 8 with respect to a point where one end of the third capacitor 41 is connected to the fifth transmission line, the third transmission line 7, and the fourth transmission line 8.

Further, the impedance 51 in the inductive region is transformed into an impedance 52 close to the real axis by the third capacitor 41, as shown in FIG. 11.

Figure 12:
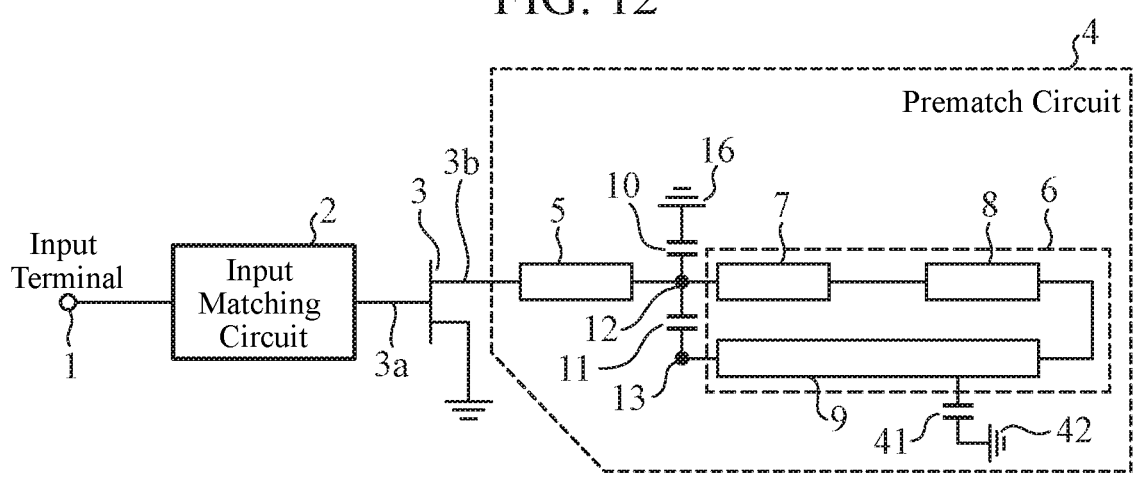
FIG. 12 is an equivalent circuit for a third harmonic wave in the amplifier shown in FIG. 10.

Here, FIG. 12 is an equivalent circuit for the third harmonic wave in the amplifier shown in FIG. 10.

An equivalent circuit for the second harmonic wave in the amplifier shown in FIG. 10 is that of FIG. 4, like that in the amplifier shown in FIG. 1.

Figure 13:
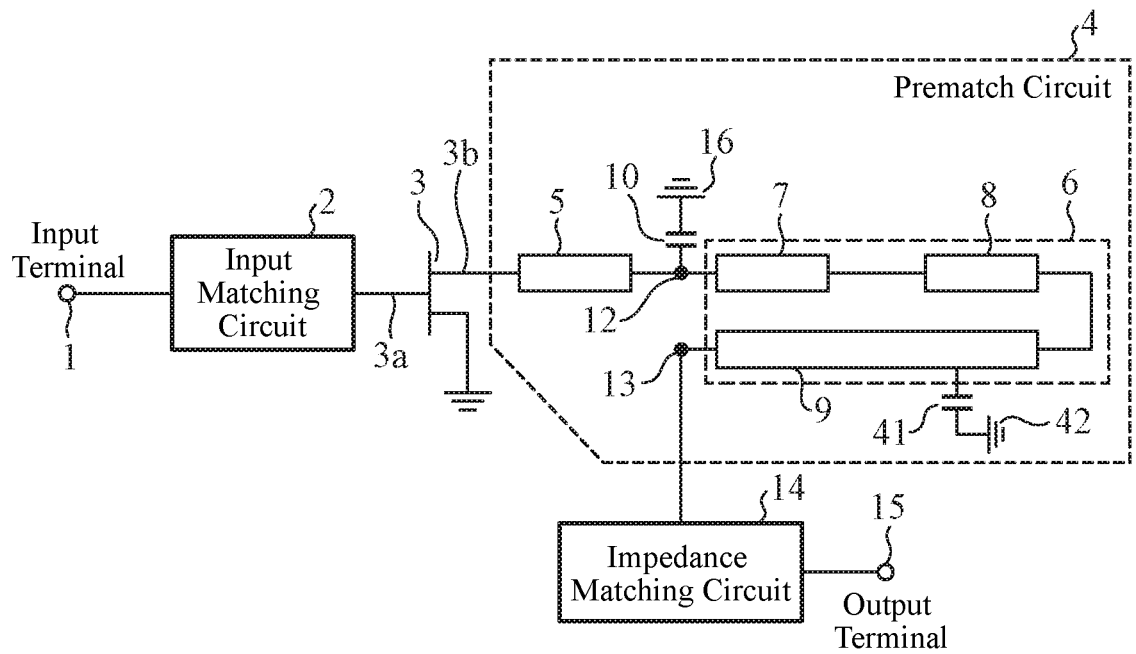

FIG. 13 is an equivalent circuit for the fundamental wave in the amplifier shown in FIG. 10.

Figure 14:
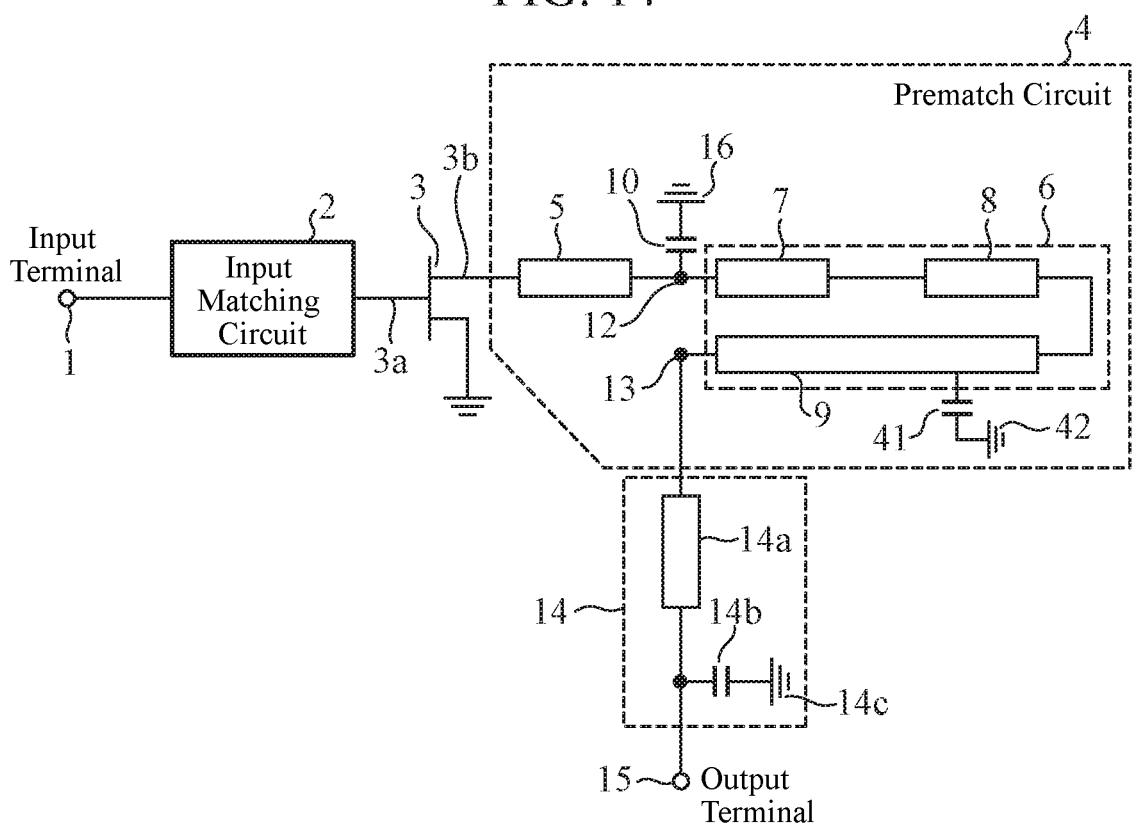
FIG. 14 is an equivalent circuit for the fundamental wave in the amplifier shown in FIG. 10.

FIG. 14 is an equivalent circuit for the fundamental wave in the amplifier shown in FIG. 10, like FIG. 13. In FIG. 14, an example of the internal configuration of an impedance matching circuit 14 is shown.

Because the circuit including the second transmission line 6, the first capacitor 10, the second capacitor 11, and the third capacitor 41 resonates at the frequency of the third harmonic wave, the impedance matching circuit 14 disappears from a connection point 13 at the frequency of the third harmonic wave, as shown in FIG. 12.

Because the first capacitor 10 resonates at the frequency of the second harmonic wave, the third transmission line 7 and the second capacitor 11 disappear from the connection point 12 at the frequency of the second harmonic wave, as shown in FIG. 4.

For the fundamental wave, the impedance 52 close to the real axis is transformed into an impedance 53 in the inductive region by a portion of the fifth transmission line 9 closer to the connection point 13 with respect to the point where the one end of the third capacitor 41 is connected to the fifth transmission line, and a transmission line 14a, as shown in FIG. 11.

The impedance 53 in the inductive region is transformed in an impedance 54 of 50Ω by a capacitor 14b, as shown in FIG. 11.

In FIG. 11, the impedance 32 is the same as the impedance 32 shown in FIG. 7.

An equi-Q circle 36 is a curve showing a Q factor of the same value, and the Q factor shown by the equi-Q circle 36 is higher than the Q factor shown by an equi-Q circle 35.

Because the impedance 53 in the inductive region has a smaller Q factor than the impedance 32, the amplifier shown in FIG. 10 can implement better impedance matching over a wide band than that implemented by the amplifier shown in FIG. 1.

Here, the line length of the second transmission line 6 is explained.

When the total inductance that the second transmission line 6 has is denoted by L and the total capacitance that the second transmission line 6 has is denoted by C, the propagation constant β of the second transmission line 6 is expressed by the following equation (1).

$$\delta \approx \omega \times (L \times c)^{0.5} \qquad (1)$$

In the equation (1), ω denotes the angular frequency.

In the amplifier shown in FIG. 10, the total capacitance C that the second transmission line 6 has is larger than that in the amplifier shown in FIG. 1 by the capacitance that the third capacitor 41 has.

Therefore, although in the amplifier shown in FIG. 10, the line length of the second transmission line 6 is shorter than that in the amplifier shown in FIG. 1, the amplifier shown in FIG. 10 can provide the same characteristics as those of the amplifier shown in FIG. 1. More specifically, the amplifier shown in FIG. 10 can be downsized further compared with the amplifier shown in FIG. 1.

Embodiment 3

As the amplifier of Embodiment 1, the example in which the prematch circuit 4 includes the first transmission line 5, the second transmission line 6, the first capacitor 10, and the second capacitor 11 is shown.

In Embodiment 3, an amplifier in which a prematch circuit 4 includes a first transmission line 5, a second transmission line 6, a first capacitor 10, a second capacitor 11, and a fourth capacitor 61 will be explained.

Figure 15:
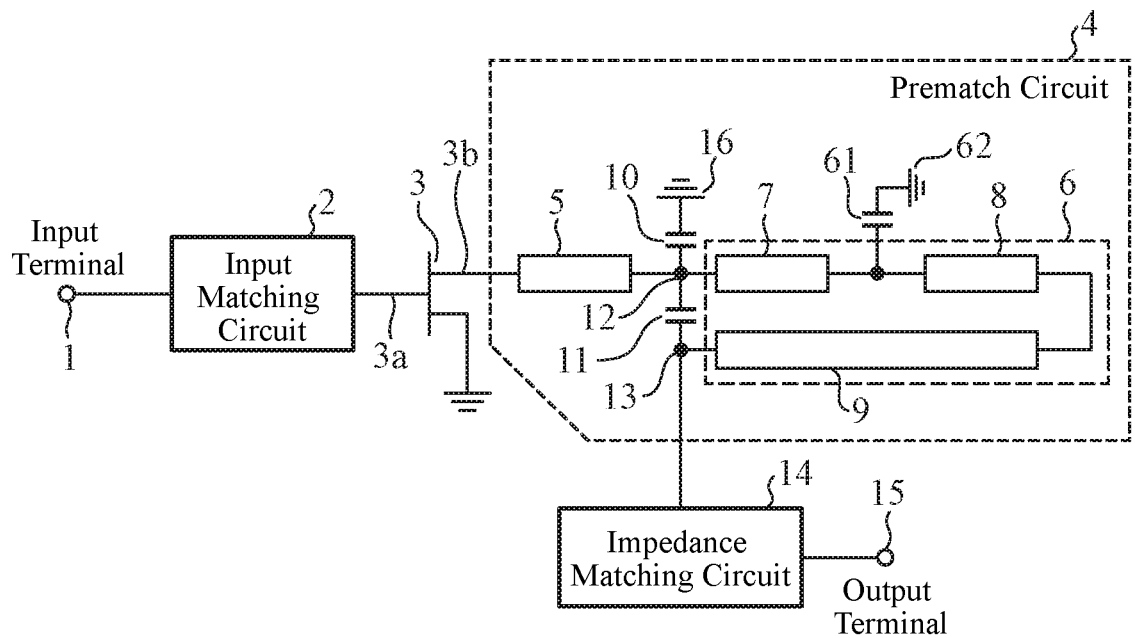
FIG. 15 is a block diagram showing an amplifier according to Embodiment 3.

FIG. 15 is a block diagram showing the amplifier according to Embodiment 3.

In FIG. 15, because the same reference signs as those shown in FIG. 1 denote the same components or like components, an explanation of the components will be omitted hereinafter.

In the fourth capacitor 61, one end is connected to the other end of a third transmission line 7, and the other end is connected to a ground 62, so that the other end is grounded.

Figure 16:
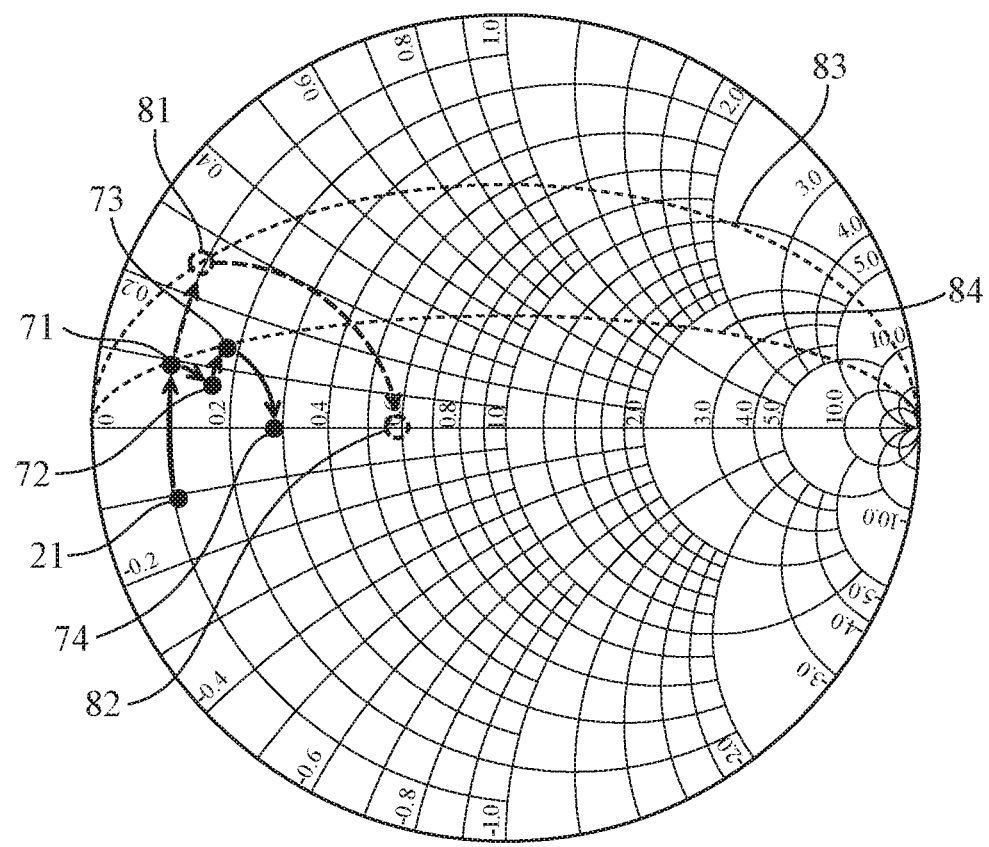
FIG. 16 is an explanatory drawing showing the impedance transformation of the amplifier according to Embodiment 3.

FIG. 16 is an explanatory drawing showing the impedance transformation of the amplifier according to Embodiment 3. In FIG. 16, the same reference signs as those shown in FIG. 2 denote the same elements or like elements.

Next, the operation of the amplifier shown in FIG. 15 will be explained by referring to FIG. 16.

The resonance frequency of the first capacitor 10 is set in such a way that the first capacitor 10 resonates at the frequency of a second harmonic wave included in a signal outputted from an amplifying element 3.

The capacitance value of the second capacitor 11 is set in such a way that the impedance for a fundamental wave in the second capacitor 11 is higher than the impedance for the fundamental wave when the third transmission line 7 is viewed from a connection point 12.

A circuit including the second transmission line 6, the first capacitor 10, the second capacitor 11, and the fourth capacitor 61 is set up in such a way as to resonate at the frequency of a third harmonic wave included in the signal outputted from the amplifying element 3.

A conjugate matched impedance 21 that is an optimum load impedance is transformed into an impedance 71 in an inductive region by the first transmission line 5, as shown in FIG. 16.

The impedance 71 in the inductive region is transformed into an impedance 72 closer to a real axis by the first capacitor 10, as shown in FIG. 16.

Further, the impedance 72 closer to the real axis is transformed into an impedance 73 by the third transmission line 7, as shown in FIG. 16.

Further, the impedance 73 is transformed into an impedance 74 close to the real axis by the fourth capacitor 61, as shown in FIG. 16.

Figure 17:
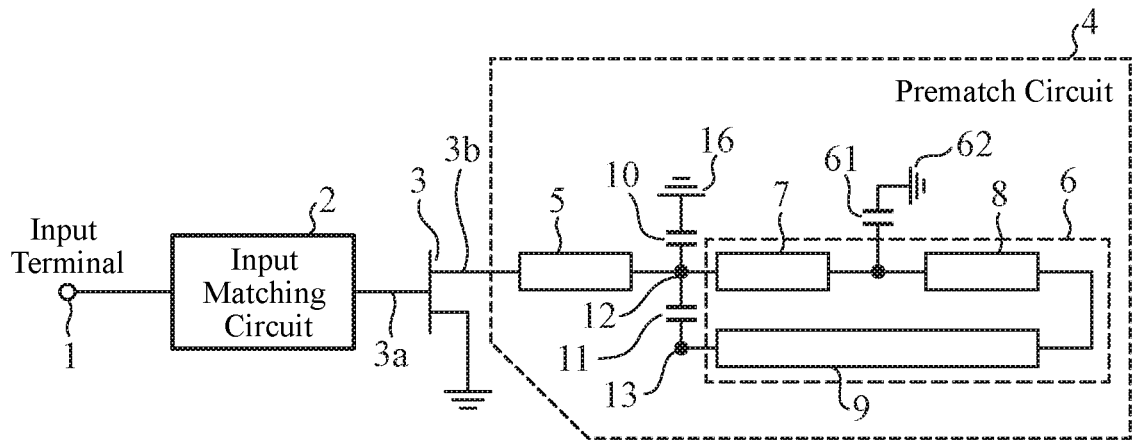
FIG. 17 is an equivalent circuit for a third harmonic wave in the amplifier shown in FIG. 15.

Here, FIG. 17 is an equivalent circuit for the third harmonic wave in the amplifier shown in FIG. 15.

An equivalent circuit for the second harmonic wave in the amplifier shown in FIG. 15 is that of FIG. 4, like that in the amplifier shown in FIG. 1.

Figure 18:
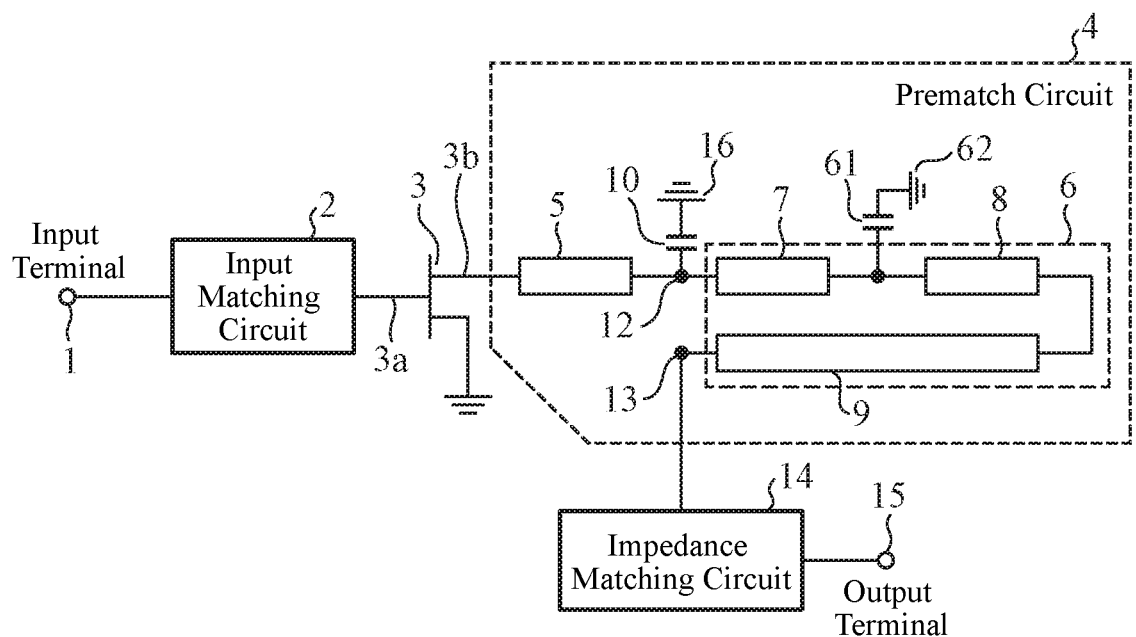

FIG. 18 is an equivalent circuit for the fundamental wave in the amplifier shown in FIG. 15.

Because the circuit including the second transmission line 6, the first capacitor 10, the second capacitor 11, and the fourth capacitor 61 resonates at the frequency of the third harmonic wave, an impedance matching circuit 14 disappears from a connection point 13 at the frequency of the third harmonic wave, as shown in FIG. 17.

Because the first capacitor 10 resonates at the frequency of the second harmonic wave, the third transmission line 7 and the second capacitor 11 disappear from the connection point 12 at the frequency of the second harmonic wave, as shown in FIG. 4.

The behavior of the impedance from an output terminal 3b for signals in the amplifying element 3 to the fourth capacitor 61 in the equivalent circuit for the fundamental wave shown in FIG. 18 will be explained.

Here, a case in which a transistor having a low conjugate matched impedance 21 that is the optimum load impedance is used as the amplifying element 3 is assumed.

In the case in which a transistor having a low conjugate matched impedance 21 is used, the first capacitor 10 needs to have a large capacitance value in order to transform the impedance 71 transformed by the first transmission line 5 into an impedance close to the real axis.

Hereinafter, an amplifier including a first capacitor 10 having a large capacitance value is assumed as an amplifier (referred to as an "amplifier for comparison" hereinafter) that is an object for comparison with the amplifier shown in FIG. 15. However, the configuration of the amplifier for comparison is the same as that of the amplifier shown in FIG. 1, and the amplifier for comparison does not include the fourth capacitor 61.

In general, a capacitor having a large capacitance value has a large physical shape, and its self-resonant frequency decreases because of increase in its parasitic inductance.

Therefore, in order to, in the amplifier for comparison, transform an impedance in the inductive region to an impedance close to the real axis by using only the first capacitor 10, it is necessary to lengthen the electric length of the first transmission line 5.

In FIG. 16, 81 denotes an impedance transformed by the first transmission line 5 whose electric length is lengthened.

The impedance 81 is one transformed into a low conductance region having inductivity. An equi-Q circle 83 is a curve showing a Q factor of the same value, and the impedance 81 exists in the equi-Q circle 83.

An equi-Q circle 84 is a curve showing a Q factor of the same value, and the Q factor shown by the equi-Q circle 84 is lower than the Q factor shown by the equi-Q circle 83.

82 denotes an impedance close to the real axis into which the impedance 81 is transformed by the first capacitor 10.

The impedance 81 exists in the equi-Q circle 83 with a high Q factor, as shown in FIG. 16, and the amplifier has a narrow band.

In the amplifier shown in FIG. 15, the electric length of the first transmission line 5 is shorter than that in the amplifier for comparison.

In the amplifier shown in FIG. 15, the conjugate matched impedance 21 that is the optimum load impedance is transformed into an impedance 71 in the inductive region by the first transmission line 5 whose electric length is shortened.

In the amplifier shown in FIG. 15, the impedance 71 in the inductive region is transformed into an impedance 72 closer to the real axis by the first capacitor 10.

Further, in the amplifier shown in FIG. 15, the impedance 72 closer to the real axis is transformed into an impedance 73 by the third transmission line 7 while a state in which the Q factor is low is maintained. The line length of the third transmission line 7 is shorter than the line length of a transmission line that causes transformation into an impedance close to the equi-Q circle 84 in which the impedance 71 exists.

Further, in the amplifier shown in FIG. 15, the impedance 73 is transformed into an impedance 74 close to the real axis by the fourth capacitor 61.

Therefore, because the amplifier shown in FIG. 15 can suppress the Q factor to low by including the fourth capacitor 61, the amplifier provides a still wider band than those of Embodiments 1 and 2.

Here, the line length of the second transmission line 6 will be explained.

When the total inductance that the second transmission line 6 has is denoted by L and the total capacitance that the second transmission line 6 has is denoted by C, the propagation constant β of the second transmission line 6 is expressed by the following equation (2).

$$\beta \approx \omega \times (L \times C)^{0.5} \quad (2)$$

In the amplifier shown in FIG. 15, the total capacitance C that the second transmission line 6 has is larger than that in the amplifier shown in FIG. 1 by the capacitance that the fourth capacitor 61 has.

Therefore, although in the amplifier shown in FIG. 15, the line length of the second transmission line 6 is shorter than that in the amplifier shown in FIG. 1, the amplifier shown in FIG. 15 can provide the same characteristics as those of the amplifier shown in FIG. 1. More specifically, the amplifier shown in FIG. 15 can be downsized further compared with the amplifier shown in FIG. 1.

Although as the amplifier shown in FIG. 15 the example in which the amplifier includes the fourth capacitor 61 is shown, the amplifier may include the third capacitor 41 shown in FIG. 10 in addition to the fourth capacitor 61.

Figure 19:
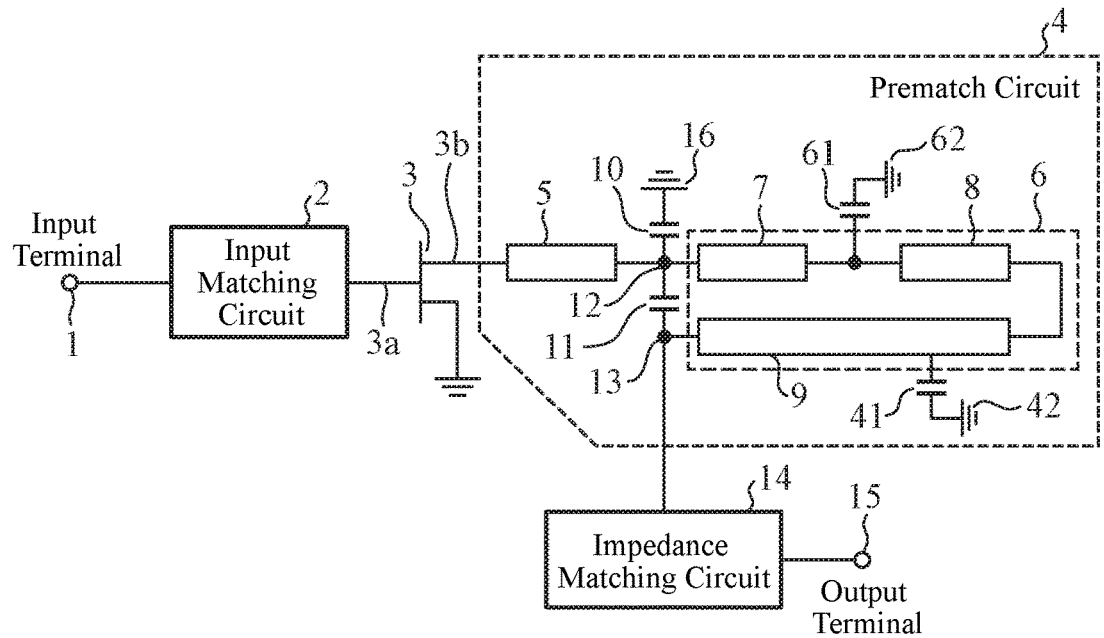
FIG. 19 is a block diagram showing another amplifier according to Embodiment 3.

FIG. 19 is a block diagram showing another amplifier according to Embodiment 3.

The amplifier shown in FIG. 19 includes a third capacitor 41 and a fourth capacitor 61.

Because the amplifier shown in FIG. 19 includes the third capacitor 41 and the fourth capacitor 61, the amplifier provides a wider band than each of the amplifiers shown in FIGS. 1, 10, and 15.

As each of the amplifiers of Embodiments 1 to 3, the example in which the amplifier includes a single amplifying element 3 and a single prematch circuit 4 is shown.

However, this amplifier is only an example, and, for example, the amplifier may include two amplifying elements 3 and two prematch circuits 4.

Figure 20:
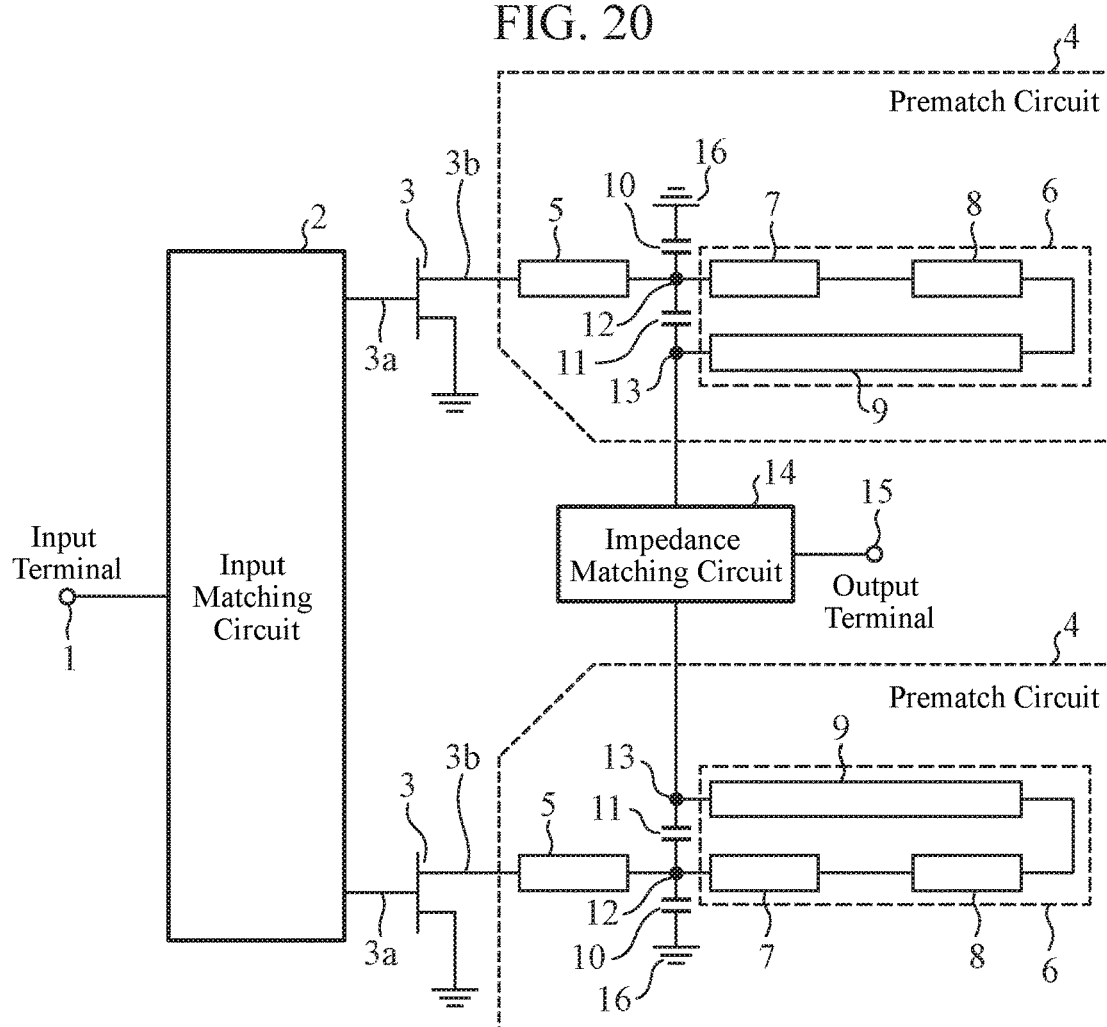
FIG. 20 is a block diagram showing an amplifier including two amplifying elements 3 and two prematch circuits 4.

FIG. 20 is a block diagram showing an amplifier that includes two amplifying elements 3 and two prematch circuits 4. In FIG. 20, the same reference signs as those shown in FIG. 1 denote the same components or like components.

As shown in FIG. 20, even an amplifier that includes two amplifying elements 3 and two prematch circuits 4 prevents the occurrence of a net loss in which the electric power of a fundamental wave is changed into heat, thereby being able to prevent reduction in the efficiency, like the amplifier shown in FIG. 1, and so on.

Figure 21A:
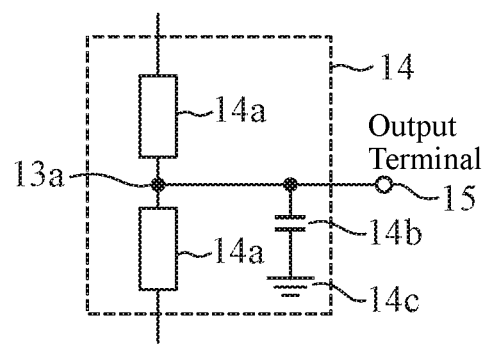
FIGS. 21A and 21B are block diagrams showing concrete examples of an impedance matching circuit 14 in the amplifier shown in FIG. 20.
Figure 21B:
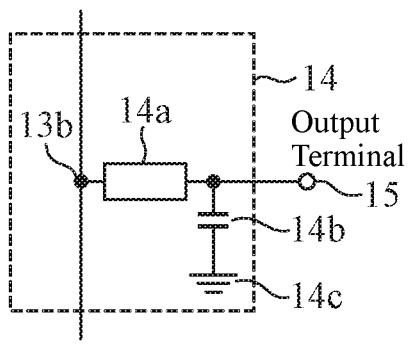

FIGS. 21A and 21B are block diagrams showing concrete examples of an impedance matching circuit 14 in the amplifier shown in FIG. 20. In FIGS. 21A and 21B, the same reference signs as those shown in FIG. 6 denote the same components or like components.

The impedance matching circuit 14 shown in FIG. 21A includes two transmission lines 14a and a single capacitor 14b.

One end of one of the two transmission lines 14a is connected to, for example, a connection point 13 of a prematch circuit 4 on the upper side of the page in FIG. 20 out of the two prematch circuits 4.

One end of the other one of the two transmission lines 14a is connected to, for example, a connection point 13 of a prematch circuit 4 on the lower side of the page in FIG. 20 out of the two prematch circuits 4.

Both the other end of the one of the transmission lines 14a and the other end of the other one of the transmission lines 14a are connected to a connection point 13a.

The impedance matching circuit 14 shown in FIG. 21B includes a single transmission line 14a and a single capacitor 14b.

In FIG. 20, the connection point 13 of the prematch circuit 4 on the upper side of the page and the connection point 13 of the prematch circuit 4 on the lower side of the page are connected to each other. In FIG. 21B, a connection point between a connection point 13 of a prematch circuit 4 on the upper side of the page and a connection point 13 of a prematch circuit 4 on the lower side of the page is denoted by 13b.

In the single transmission line 14a, one end is connected to the connection point 13b, and the other end is connected to an output terminal 15.

It is to be understood that any combination of two or more of the above-mentioned embodiments can be made, various changes can be made in any component according to any one of the above-mentioned embodiments, and any component according to any one of the above-mentioned embodiments can be omitted within the scope of the present disclosure.

INDUSTRIAL APPLICABILITY

The present disclosure is suitable for an amplifier that includes an amplifying element for amplifying an inputted signal.

REFERENCE SIGNS LIST

1: input terminal,
2: input matching circuit,
3: amplifying element,
3a: input terminal,
3b: output terminal,
4: prematch circuit,
5: first transmission line,
6: second transmission line,
7: third transmission line,
8: fourth transmission line,
9: fifth transmission line,
10: first capacitor,
11: second capacitor,
12: connection point,
13, 13a, and 13b: connection point,
14: impedance matching circuit,
14a: transmission line,
14b: capacitor,
14c: ground,
15: output terminal,
16: ground,
21: conjugate matched impedance that is optimum load impedance,
22 and 23: transformed impedance,
31, 32, and 33: transformed impedance,
34, 35, and 36: equi-Q circle,
41: third capacitor,
42: ground,
51, 52, 53, and 54: transformed impedance,
61: fourth capacitor,
62: ground,
71, 72, 73, and 74: transformed impedance,
81 and 82: transformed impedance, and
83 and 84: equi-Q circle

What is claimed is:

1. An amplifier comprising:
an amplifying element for amplifying an inputted signal and outputting the amplified signal;
a first transmission line in which one end is connected to an output terminal for signals in the amplifying element;
a second transmission line in which one end is connected to the other end of the first transmission line;
a first capacitor in which one end is connected to the other end of the first transmission line, and the other end is grounded;
a second capacitor in which one end is connected to the other end of the first transmission line, and the other end is connected to the other end of the second transmission line; and
an impedance matching circuit in which one end is connected to the other end of the second transmission line, and the other end thereof is connected to the output terminal, and that matches impedance for a fundamental wave included in the signal outputted from the amplifying element, and after matching the impedance, outputs a signal via the output, terminal connected to the other end thereof,
wherein the first capacitor resonates at a frequency of a second harmonic wave included in the signal outputted from the amplifying element, and a circuit including the second transmission line, the first capacitor, and the second capacitor resonates at a frequency of a third harmonic wave included in the signal outputted from the amplifying element and also matches the impedance for the fundamental wave together with the impedance matching circuit.

2. The amplifier according to claim 1, wherein the second transmission line includes a third transmission line in which one end is connected to the other end of the first transmission line, a fourth transmission line in which one end is connected to the other end of the third transmission line, and a fifth transmission line in which one end is connected to the other end of the fourth transmission line, and the other end is connected to the other end of the second capacitor.

3. The amplifier according to claim 2, wherein the amplifier includes a third capacitor in which one end is connected to the fifth transmission line, and the other end is grounded.

4. The amplifier according to claim 2, wherein the amplifier includes a fourth capacitor in which one end is connected to the other end of the third transmission line, and the other end is grounded.

5. The amplifier according to claim 2, wherein the amplifier includes a third capacitor in which one end is connected to the fifth transmission line, and the other end is grounded, and a fourth capacitor in which one end is connected to the other end of the third transmission line, and the other end is grounded.

* * * * *